United States Patent
Cordingley et al.

(10) Patent No.: US 8,367,968 B2
(45) Date of Patent: Feb. 5, 2013

(54) SYSTEM AND METHOD FOR MULTI-PULSE LASER PROCESSING

(75) Inventors: James Cordingley, Littleton, MA (US); Dimitry Maltsev, Carlisle, MA (US); Michael Plotkin, Newton, MA (US)

(73) Assignee: GSI Group Corporation, Bedford, MA (US)

(*) Notice: Subject to any disclaimer, the term of this patent is extended or adjusted under 35 U.S.C. 154(b) by 1331 days.

(21) Appl. No.: 11/969,000

(22) Filed: Jan. 3, 2008

(65) Prior Publication Data

US 2008/0164240 A1  Jul. 10, 2008

Related U.S. Application Data

(60) Provisional application No. 60/883,583, filed on Jan. 5, 2007.

(51) Int. Cl.
    *B23K 26/38* (2006.01)
(52) U.S. Cl. ............ 219/121.61; 219/121.76; 219/121.8
(58) Field of Classification Search ............ 219/121.61, 219/121.62, 121.68, 121.69, 121.76, 121.8; 359/285, 286, 287; 372/13, 26
See application file for complete search history.

(56) References Cited

U.S. PATENT DOCUMENTS

| | | | |
|---|---|---|---|
| 5,812,569 A | 9/1998 | Walker et al. | |
| 5,998,759 A | 12/1999 | Smart | |
| 6,285,002 B1 | 9/2001 | Ngoi et al. | |
| 6,339,604 B1 * | 1/2002 | Smart | 372/26 |
| 6,541,731 B2 | 4/2003 | Mead et al. | |
| 6,559,412 B2 | 5/2003 | Lauer et al. | |
| 6,727,458 B2 | 4/2004 | Smart | |
| 6,831,936 B1 | 12/2004 | Smart | |
| 7,616,669 B2 * | 11/2009 | Grant et al. | 372/26 |
| 8,081,668 B2 * | 12/2011 | Grant et al. | 372/26 |
| 2002/0162973 A1 | 11/2002 | Cordingley et al. | |
| 2002/0167581 A1 | 11/2002 | Cordingley et al. | |
| 2003/0151053 A1 * | 8/2003 | Sun et al. | 257/79 |
| 2004/0264517 A1 * | 12/2004 | Sun et al. | 372/26 |
| 2005/0100062 A1 * | 5/2005 | Grant et al. | 372/10 |
| 2005/0150879 A1 | 7/2005 | Gu et al. | |
| 2005/0184036 A1 * | 8/2005 | Hunter et al. | 219/121.69 |
| 2006/0140230 A1 * | 6/2006 | Sun et al. | 372/25 |
| 2006/0191884 A1 * | 8/2006 | Johnson et al. | 219/121.77 |

FOREIGN PATENT DOCUMENTS

JP   7-16781 A   *   1/1995

OTHER PUBLICATIONS

D. Smart & J. Edwards, "Link Processing with Lasers", General Scanning Inc., 1998, pp. 1-20.
J.F. Ready (ed.), LIA Handbook of Laser Material Processing, Chapter 19, Laser Institute of America, 2001, pp. 595-615.
WaferRepair (TM) M-455, Fuse Processing System, GSI Group Inc., www.gsig.com/systems, Oct. 2005, pp. 1-2.
Chinese Office Action issued on Aug. 23, 2011 in connection with Chinese Patent Application No. 200880001706.2, 10 pages.

* cited by examiner

*Primary Examiner* — Geoffrey S Evans
(74) *Attorney, Agent, or Firm* — Gesmer Updegrove LLP

(57) ABSTRACT

Laser pulses are selected from a group of closely spaced laser pulses with an optical modulator by adjusting pulse timing relative to an impingement interval. An adjusted pulse is moved from an impingement interval to a non-impingement interval and is blocked. The blocked laser source is stabilized by running nearly continuously. Pulse selection with multiple laser sources is achieved with a single acousto-optic modulator.

26 Claims, 8 Drawing Sheets

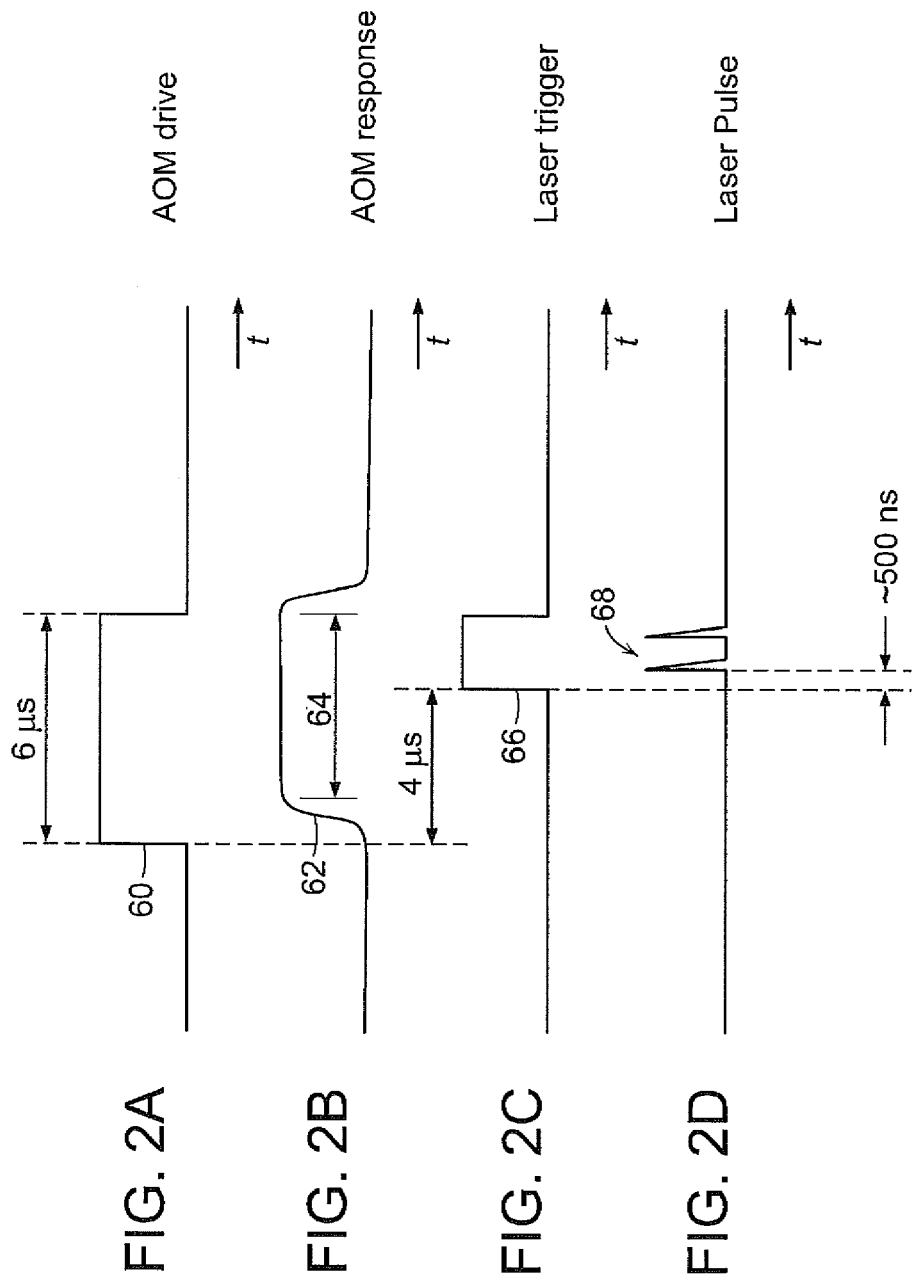

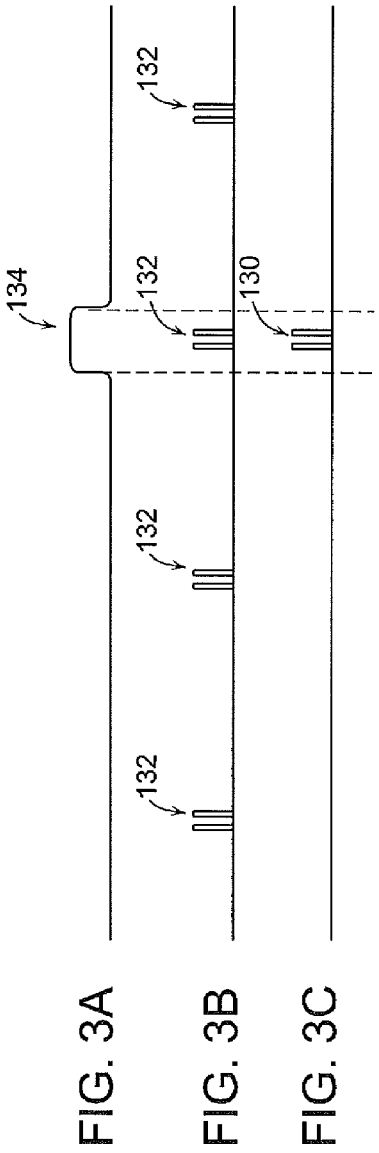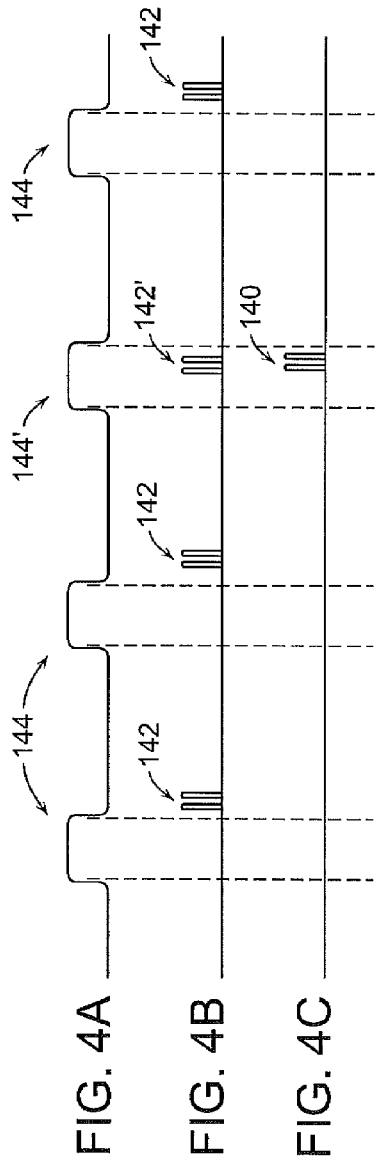

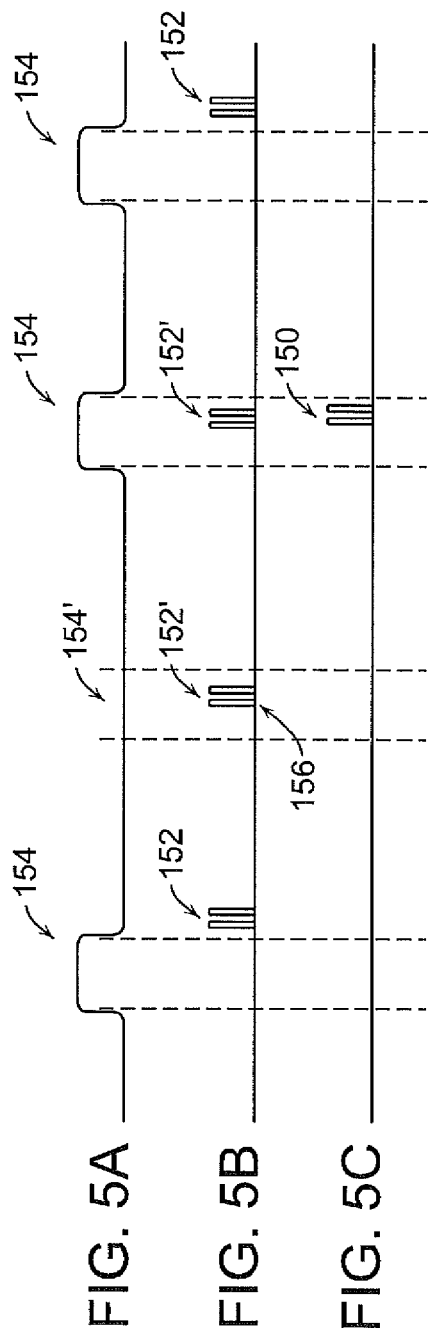

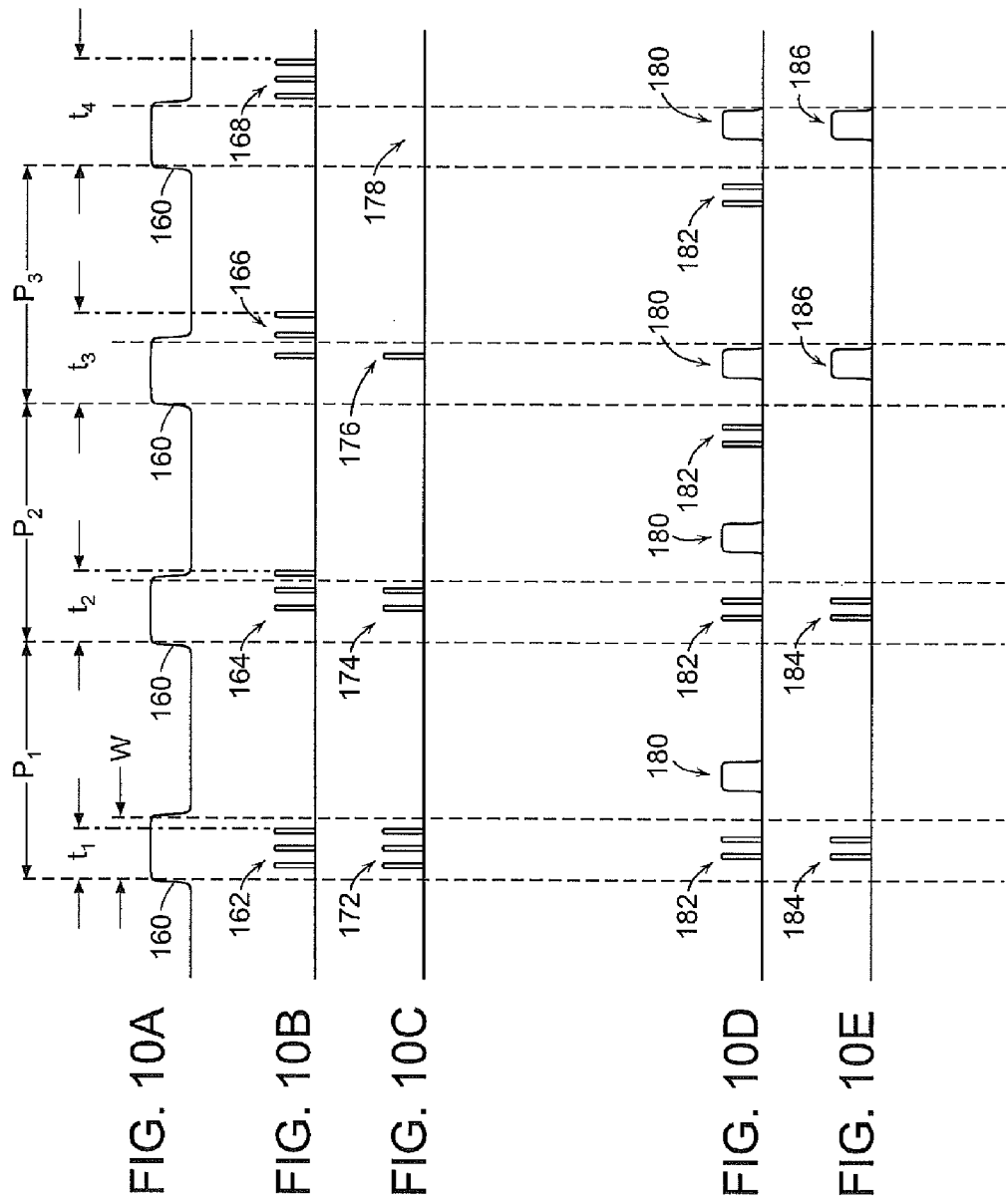

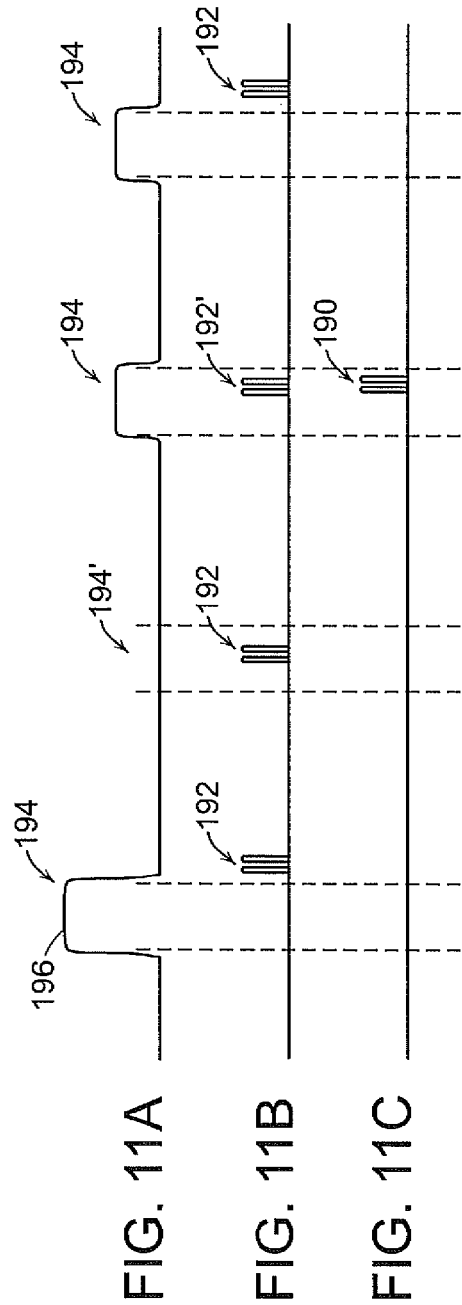

SYSTEM AND METHOD FOR MULTI-PULSE LASER PROCESSING

PRIORITY

This application claims priority to U.S. Provisional Patent Application Ser. No. 60/883,583, filed Jan. 5, 2007.

BACKGROUND

The present invention generally relates to laser processing systems as disclosed, for example, in U.S. Pat. Nos. 6,559,412; 5,812,569; 5,998,759; 6,339,604; 6,727,458; and 6,541,731 as well as U.S. Patent Application Publication Number No. 2002/0167581, each of which is assigned to the assignee of the present invention, and each of which is hereby incorporated by reference in its entirety. Laser based micromachining for memory repair of integrated circuits, for example, is disclosed in LIA Handbook of Laser Materials Processing, by John Ready, Laser Institute of America, Mongolia Publishing Co., Inc. (2001), chapter 19.

The above mentioned laser processing systems are generally used for a variety of micromachining tasks including, for example, blowing links of integrated circuits to repair memory devices. In such laser processing systems, a laser source generates pulses that are positioned and focused on a workpiece to perform the processing task. For high-speed precision processing of regularly spaced targets, such as one dimensional (1D) or two dimensional (2D) arrays of links for memory repair, lasers are pulsed at a pulse rate that approximately corresponds to the link pitch, and an optical switch is used to select pulses to blow only selected links. Since the laser source is operated at a near constant rate, the pulse energy is consistent which is desired for processing capability. Pulses may be generated during motion of a target relative to a laser pulse. Conventional laser processing systems such as those identified above generally involve pulse generation with various laser sources, pulse selection, and beam delivery for processing links or similar microscopic structures.

One type of optical switch used in the optical path between the laser source and the focus lens (e.g., external to the laser cavity) to select pulses is an acousto-optic modulator (AOM). This type of switch may be used to attenuate pulses and to set the output pulse energy for the selected pulses. The pulse energy may be set according to the processing parameters, or to a low energy level for beam alignment.

The optical rise time of AOMs is generally slower than Electro-Optic-Modulators (EOMs, Pockel Cells). The ease of use however, continues to make the AOM an attractive option. Although development of integrated electro-optic switches with half-wave voltages of a few volts and nanosecond or faster rise is progressing, AOMs are a well established alternative for most micromachining applications.

In some micromachining applications including memory repair, multiple pulses may be delivered to the workpiece in a group of closely spaced pulses. A suitable single laser, for example a mode-locked laser or semiconductor diode, may produce a rapid burst of pulses. Alternatively, multiple closely spaced pulses may be generated with a system in which outputs of two or more laser sources are combined.

It is desirable to provide pulse selection within a group of multiple pulses for processing and alignment. Intermittent pulsing, however, may generally lead to unstable pulse energy. Each source may be continuously pulsed and modulated by a modulator for each laser source. This however, is not a preferred solution. Pulse selection with a single modulator is desirable, but close spacing of less than about 100 ns within a group is generally beyond the limits of most acousto-optic modulators. There is a need therefore, for pulse selection within a group of closely space pulses that provides stable laser operation using a single modulator.

SUMMARY OF THE INVENTION

The invention generally provides for adjusting laser pulse timing with respect to impingement intervals that are aligned with respect to microstructures such that the pulses may either impinge a desired target on the microstructure, or not impinge the microstructure.

In accordance with an embodiment, the invention provides a stabilized system for laser-based processing a workpiece. The system includes one or more laser sources to generate laser pulses, at least some of the pulses being closely spaced in time. The system also includes an optical switch that provides impingement intervals and non-impingement intervals in response to one or more control signals, wherein a laser pulse present during an impingement interval is allowed to propagate to a workpiece location. The system also includes a controller that is coupled to the laser and optical switch to either allow a pulse to propagate to the workpiece if a pulse is desired, or to time shift a pulse to a non-impingement interval if a pulse is not desired, the time shift being sufficiently small to maintain stable operation, and sufficiently large to prevent significant energy from impinging the workpiece (as a result of the finite response time of the optical switch).

In accordance with a further embodiment, the invention provides a method of laser-based processing a workpiece. The method includes the step of providing one or more laser sources to generate laser pulses, at least some of the pulses being closely spaced in time. The method also includes the step of providing impingement intervals and non-impingement intervals in response to one or more control signals, wherein a laser pulse present during an impingement interval is allowed to propagate to a workpiece location. The method also includes the step of providing a controller that is coupled to the laser and optical switch to either allow a pulse to propagate to the workpiece if a pulse is desired, or to time shift a pulse to a non-impingement interval if a pulse is not desired, the time shift being sufficiently small to maintain stable operation, and sufficiently large to prevent significant energy from impinging the workpiece (as a result of the finite response time of the optical switch).

BRIEF DESCRIPTION OF THE ILLUSTRATED EMBODIMENTS

The following description may be further understood with reference to the accompanying drawings in which:

FIGS. 2A-2D show illustrative graphical views of an AOM command, an AOM response, a laser trigger, and a pair of pulses in a system in accordance with an embodiment of the invention;

FIGS. 3A-3C show illustrative graphical views of an optical response to a selective AOM command, and corresponding groups of laser pulses and selected pulses in a system in accordance with a further embodiment of the invention;

FIGS. 4A-4C show illustrative graphical views of an optical response to an AOM command sequence, and corresponding groups of laser pulses and selected pulses in a system in accordance with a further embodiment of the invention;

FIGS. 5A-5C show illustrative graphical views of an optical response to a AOM command sequence, and corresponding groups of laser pulses and selected pulses in a system in accordance with a further embodiment of the invention;

Figure 1:
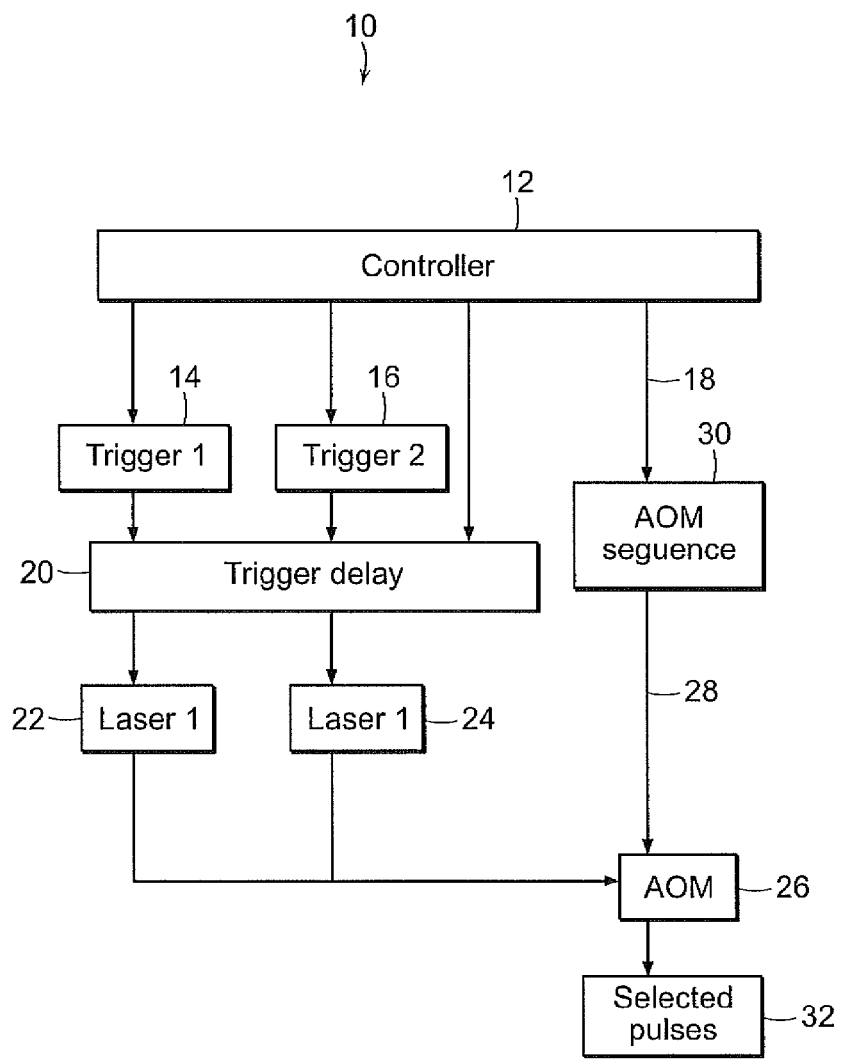
FIG. 1 shows an illustrative schematic diagram showing pulse timing control and timing AOM control.

FIGS. 10A-10E show illustrative graphical views of an optical response to an AOM command, and corresponding groups of laser pulses and selected pulses in a system in accordance with another embodiment of the invention; and FIGS. 11A-11C show illustrative graphical views of an optical response to a further AOM command sequence, and corresponding groups of laser pulses and selected pulses in a system in accordance with a further embodiment of the invention.

The drawings are shown for illustrative purposes only.

DETAILED DESCRIPTION

An object of the present invention is to provide improved methods and systems for laser processing of multi-material devices. A further object of the present invention is to provide a stabilized laser source and laser pulses that are selected from a group of laser pulses. The groups of laser pulses may be provided either at a repetition rate with or without timing adjustments wherein, for example, the system permits adjustment of the laser output timing during operation to provide pulse selection.

In carrying out the above objects and other objects of the present invention, system and method embodiments are provided for laser processing of a multi-material device including a substrate and at least one microstructure. The processing occurs with multiple pulses in a single pass operation that is controlled with a positioning subsystem of a laser processing system. The positioning subsystem induces relative motion between the device and laser beam waists. During relative motion, an impingement interval related to a target position allows one or more laser pulses to impinge the workpiece. The method includes generating a first pulse having a first predetermined characteristic, and irradiating a target during the impingement interval with the first pulse wherein a first beam waist, which is associated with the first pulse, and the target substantially coincide. The method also includes generating a second pulse having a second predetermined characteristic. The second pulse is delayed a predetermined time relative to the first pulse. The predetermined time is small enough to maintain stable operation and large enough to move the delayed pulse from the impingement interval to an adjacent non-impingement interval and to block the second pulse from irradiating the target. The processing cleanly removes the at least one microstructure. The target may be an alignment target or a microstructure. The microstructure may be a conductive link.

The first and second pulses may be independently triggered so that the second pulse is delayed for the predetermined time relative to the first pulse based on the predetermined time. In various embodiments, the predetermined time may be determined by a thermal property of the substrate wherein during processing substrate temperature is substantially reduced after the predetermined time compared to the temperature of the substrate during the step of irradiating the at least one microstructure with the second pulse. The predetermined time may be in the range of about 1-500 nanoseconds, and in other embodiments, the predetermined time may be in the range of about 1-200 nanoseconds, and in further embodiments, the predetermined time may be in the range of about 30-60 nanoseconds. The steps of generating may include providing an optical subsystem having multiple lasers wherein relative delay between trigger pulses to the optical subsystem corresponds to the predetermined time.

For longer delays, for example longer than 200 nanoseconds, beam scanning techniques may be employed to reduce or eliminate relative motion between a laser spot and a target position. Relative motion is determined by the positioning velocity and timing delay, for example 200 nanoseconds at a positioning velocity of 200 millimeters per second corresponds to 40 nanometers of relative motion.

Further in carrying out the above objects and other objects of the present invention, a system for laser processing of a multi-material device may include a substrate and at least one microstructure. The processing occurs with multiple pulses in a single pass operation that is controlled with a positioning subsystem that induces relative motion between the device and laser beam waists. During relative motion, an impingement interval related to target position allows one or more laser pulses to impinge the workpiece. The system includes means for generating a first pulse having a first predetermined characteristic, and means for irradiating a target during the impingement interval with the first pulse wherein a first beam waist associated with the first pulse and the at least one target substantially coincide. The system also includes means for generating a second pulse having a second predetermined characteristic. The second pulse is delayed a predetermined time relative to the first pulse. The predetermined time is small enough to maintain stable operation and large enough to move the delayed pulse from the impingement interval to an adjacent non-impingement interval and to block the second pulse from irradiating the target. The system further includes means to block the irradiating of the at least one microstructure with the second pulse wherein the second pulse is moved from an impingement interval to an adjacent non-impingement interval thereby blocking the second pulse from irradiating at least one microstructure. The processing cleanly removes the at least one microstructure. The target may be an alignment target, and the microstructure may be a conductive link.

The first and second pulses may be independently triggered so that the second pulse is delayed for the predetermined time relative to the first pulse based on the predetermined time. The predetermined time may be determined by a thermal property of the substrate during processing wherein substrate temperature is substantially reduced after the predetermined time compared to the temperature of the substrate during irradiation of the at least one microstructure with the second pulse. The predetermined time may be in the range of about 1-500 nanoseconds. In further embodiments, the predetermined time may be about 30-60 nanoseconds.

The means for generating the first and second pulses may include an optical subsystem having multiple lasers wherein relative delay between trigger pulses to the optical subsystem corresponds to the predetermined time.

Further in carrying out the above objects and other objects of the present invention, a method of selecting laser pulses from a group of laser pulses with an optical modulator is provided. The method includes generating a first sequence of laser pulses corresponding to a first laser trigger signal. The method also includes generating a second sequence of laser pulses corresponding to a second laser trigger signal, wherein corresponding pulses from the first and second sequences form a group of pulses that are closely spaced in time. The method includes propagating the first and second sequences of laser pulses through an optical modulator that is controlled to selectively allow one or more pulses to impinge a workpiece only during pulse impingement intervals. The method further includes the steps of selecting a pulse in a pulse group to impinge a work piece by initiating a pulse impingement interval with an AOM sequence, and adjusting the timing of at least one trigger signal to generate at least one adjusted pulse in the pulse group, such that the adjusted pulse moves from the pulse impingement interval to an adjacent pulse blocking interval.

The adjusted pulse may be a delayed pulse, and the delay may be more than 2 microseconds. In further embodiments, the delay may be about 2-3 microseconds. The step of adjusting at least one trigger signal may involve adjusting the first or the second trigger signal to select pulses generated from the respective first or second sequence of laser pulses. The group of pulses may comprise two or more closely spaced pulses, and the pulse spacing may be 1-500 ns.

The first pulse sequence may be generated with a first laser source and the second pulse sequence may be generated with a second laser source. The modulator may be an acousto-optic modulator, an acousto-optic deflector, or an electro-optic modulator. The step of propagating may include the step of combining a first beam and a second beam. Combining may be combining with a beam combining optic. The beam combining optic may be a polarization sensitive optic. The combined beams may be parallel or divergent. The method may include the step of controlling energy of each selected pulse with the modulator.

Further in carrying out the above objects and other objects of the present invention, a system of selecting laser pulses from a group of laser pulses with an optical modulator is also provided. The system provides for the generation a first sequence of laser pulses corresponding to a first laser trigger signal, and also provides for the generation of a second sequence of laser pulses corresponding to a second laser trigger signal, wherein corresponding pulses from the first and second sequences form a group of pulses that are closely spaced in time. The system also provides for the propagation of the first and second sequences of laser pulses through an optical modulator that is controlled to selectively allow one or more pulses to impinge a workpiece only during pulse impingement intervals. The system further provides for the selection of a pulse in a pulse group to impinge a work piece by initiating a pulse impingement interval with an AOM sequence, and the adjustment of the timing of at least one trigger signal to generate at least one adjusted pulse in the pulse group, such that the adjusted pulse moves from the pulse impingement interval to an adjacent pulse blocking interval.

The adjusted pulse may be a delayed pulse, and the delay may be more than 2 microseconds. In further embodiments, the delay may be about 2-3 microseconds. The adjustment of at least one trigger signal may involve adjusting the first or the second trigger signal to select pulses generated from the respective first or second sequence of laser pulses. The group of pulses may comprise two or more closely spaced pulses, and the pulse spacing may be 1-500 ns. In further embodiments, the pulse spacing may be up to 200 ns.

The first pulse sequence may be generated with a first laser source and the second pulse sequence may be generated with a second laser source. The modulator may be an acousto-optic modulator, an acousto-optic deflector, or an electro-optic modulator. The propagation of the first and second sequences of laser pulses may include combining a first beam and a second beam, for example with a beam combining optic. The beam combining optic may be a polarization sensitive optic. The combined beams may be parallel or divergent. The system may also provide for the controlling of energy of each selected pulse with the modulator.

Further in carrying out the above objects and other objects of the present invention, a method of stabilizing a laser source in an aligned multiple pulse laser processing system is provided. The method includes generating a first sequence of laser pulses at a pulse repetition rate. The method also includes propagating the first sequence of laser pulses through an optical modulator that is controlled according to an AOM command sequence to allow one or more pulses to impinge a workpiece during pulse impingement intervals. The method includes impinging selected pulses from the first pulse sequence onto the work piece at corresponding pulse impingement intervals. The method further includes delaying the first sequence of laser pulses by adjusting pulse timing relative to corresponding pulse impingement intervals to move the first pulse sequence from corresponding pulse impingement intervals to adjacent pulse blocking intervals, thereby blocking the first pulse sequence, wherein the step of generating is substantially continuous and the laser source is stabilized.

The method may include generating a second sequence of laser pulses wherein each pulse of the second sequence corresponds to a pulse in the first sequence of laser pulses, and propagating the second sequence of laser pulses through the optical modulator to impinge a work piece during at least one pulse selecting time interval.

In an embodiment of the invention, pulses are generated from two commercially available q-switched laser sources and then combined to provide a laser pulse sequence. In particular, the laser sources produce a green output wavelength (e.g., about 0.5 µm to about 0.6 µm), and may include any necessary wavelength shifters, such as a frequency doubler to convert a primary infrared beam to green.

Referring to FIG. 1, a system 10 in accordance with an embodiment of the invention includes a controller 12 (such as the Model M455 memory repair system controller sold by GSI Group Corporation of Billerica, Mass.), that provides two laser trigger signals 14 and 16 as well as a modulator control signal 18. The laser trigger signals 14 and 16 pass through a trigger delay unit 20 and are then coupled respectively to laser sources 22 and 24 (e.g., two commercially available diode pumped solid state green q-switched laser sources such as the Model QG532-300-YV laser manufactured by CrystaLaser of Reno, Nev.). Alternately, the controller may include trigger delay capability and output independently programmable trigger signals. The two independently programmable laser outputs are then combined and provided to a modulator 26 such as an AOM. The modulator 26 receives RF control signals in AOM command sequence 30 responsive to the AOM firing sequence 18. The laser outputs are combined such that pairs of pulses are provided (one from each laser) that are closely spaced. For each pair of pulses, the modulator 26 transmits either a pulse from each laser (the pair of pulses), only one pulse from the pair or no pulses from the pair to be directed toward a work surface as part of a pulse sequence 32.

The RF modulator drive signal, for example having a 6 µs width as shown at 60 in FIG. 2A generates a corresponding AOM optical response 62 as shown in FIG. 2B. The impingement interval 64 may be defined as a portion of the AOM response 62. The interval 64 may include a uniform portion of the actual AOM optical response 62. The laser is shown triggered during this impingement interval 64 for example at 66 in FIG. 2C, and FIG. 2D shows two pulses 68 occurring (after a characteristic pulse forming delay) in the impingement interval 64.

The (finite) rise time of an acousto-optic deflector depends upon AOM aperture size and acoustic velocity. A typical rise/fall time may be tens of hundreds or nanoseconds. The width of an impingement interval may be determined according to suitable pulse characteristic(s). For example, pulse to pulse energy uniformity at the workpiece may be a typical pulse specification. If 10% energy variation is acceptable, an impingement interval may be wider than that where 1% pulse-pulse uniformity is required.

FIGS. 3A-3C show a pulse timing and modulation system in accordance with another embodiment of the invention in which the modulation control signal provides selective modulation at desired times (rather than a repeated modulation signal) to selectively permit output pulses 130 from groups of laser pulses 132 during an impingement interval 134. In this example, the modulator is engaged to produce a response, either by activating a first order response (turning on a normally off AOM) or by deactivating a first order response (turning off a normally on AOM), to provide an impingement internal only when it is needed.

FIGS. 4A-4C show a pulse timing and modulation system in accordance with another embodiment of the invention in which the modulation control signal provides a modulation sequence that transmits output pulses 140 from groups of laser pulses 142 during an impingement interval 144 that aligns with the pulses 142. In this example, the modulator repetition rate is constant and the phase of group 144 is shifted with a timing advance to select pulses for output 140.

FIGS. 5A-5C show a pulse timing and modulation system in accordance with another embodiment of the invention in which the modulation control signal provides a modulation sequence including non-impingement interval 154 to selectively block pulse group 156. Pulse groups 152 are time shifted to occur in during an impingement interval 154, however the modulator output at 154 is suppressed to block pulse group 156, but pulse group 152 at an impingement interval 154 is transmitted into output 150. The time period between blocked group 156 output 150 can be set to stabilize the energy of output 150, for example set to the basic period of the modulation sequence including intervals 154 and 154'. In this embodiment, the modulation control signal is not provided as a strictly repeating signal, but rather is irregular to provide improved output stability. In particular, as shown at 156, even though these pulses are within what would have been an impingement interval if the modulation signal was repeated, no output is provided because the modulation signal was not triggered at that time and output pulse group 150 is generated with a normal pulse group spacing.

Figure 6:
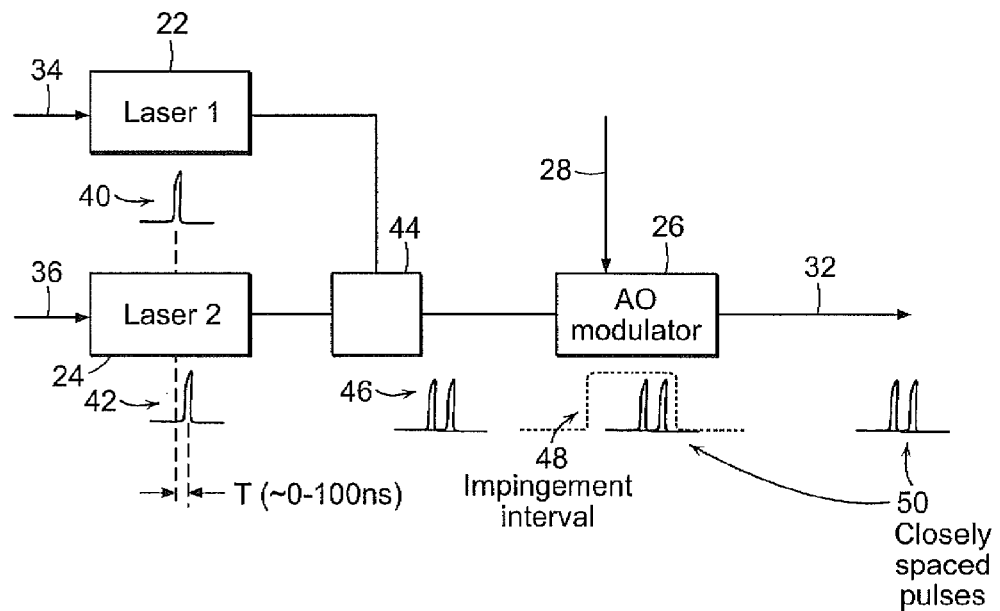
FIG. 6 shows an illustrative schematic diagram showing dual pulse generation, pulse timing, and pulse group selection.

FIG. 6 shows a diagrammatic illustration of the process of combining the pulses from two laser sources and selecting both pulses for the pulse sequence 32. The pulsing of the two lasers is nearly continuous at a nominal pulse rate of 70 kHz and generates two independent and stabilized sequences of laser pulses responsive to independent laser trigger signals 34 and 36. As shown at 40 and 42, the pulses may be separated in time by zero to 500 ns. These independent pulse sequences are combined with a polarization type beam combiner 44 to form a combined sequence of laser pulses 46 which includes groups (e.g., pairs) of closely space pulses. The impingement interval 48 permits both pulses to be output by the system as shown at 50.

The pulse spacing T, (i.e., the time between pulses in each pulse group) is controlled by the relative delay between the corresponding trigger signals 34 and 36. The delay can be set from zero up to the period of the nominal pulse repetition rate or up to about 14 microseconds. For typical dual pulse processing, the delay is set from zero (100% temporal overlap between pulses) to about 500 nanoseconds, and is generally less than about 1 microsecond. In further embodiments, the pulse spacing may be larger but pulse spacing in constrained by the length of the non-impingement interval.

The modulator 26 may be, for example, an acousto-optic modulator such as a low thermal drift model N23080-3-0.532-LTD manufactured by NEOS Technologies, Inc. of West Melbourne, Fla. The acousto-optic modulator is located between the beam combiner and a focusing lens. The modulator is operated by programmable timing signals 18 from the system controller 12 that initiate the AOM firing sequence that controls (e.g., gates) modulation of the RF drive signal to the modulator. During an impingement interval 48 (which occurs between the rising and falling edges of the window of the AOM optical response as discussed below), one or more pulses may be directed toward a work piece. Accordingly, RF signals at a predetermined frequency are applied to the AOM. RF signals at the predetermined frequency are not applied during non-impingement intervals. The impingement intervals are timed to correspond with the location of targets, and during an impingement interval one or more pulses can propagate from the laser to the work piece. During non-impingement intervals, pulses cannot propagate from either laser source to the work piece. The laser pulses may be generated closer toward the falling edge of the window of the AOM optical response as shown in FIG. 6.

Figure 7:
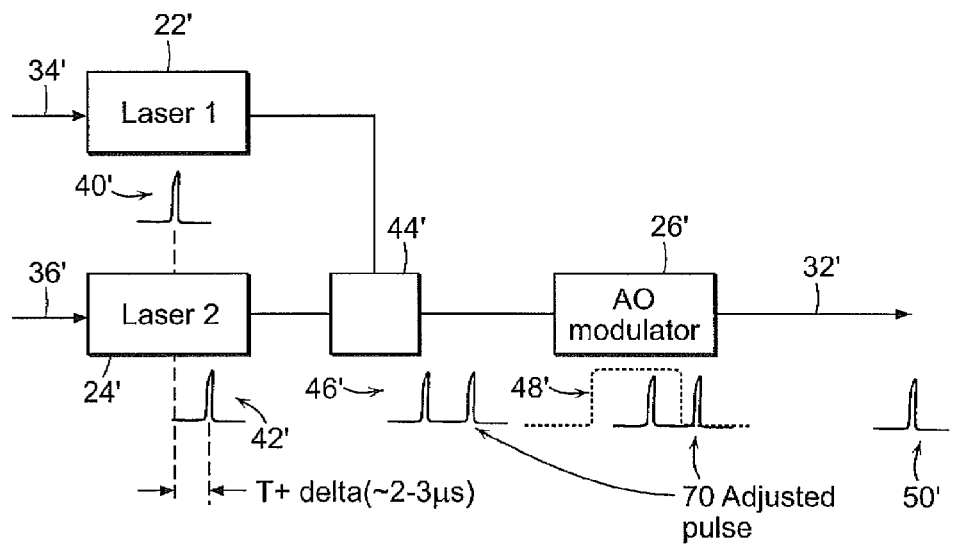
FIG. 7 shows an illustrative schematic diagram showing dual pulse generation, delayed pulse timing, and single pulse selection in accordance with another embodiment of the invention.

Referring now to FIG. 7, in accordance with a further embodiment of the invention, pulse timing may be controlled relative to the impingement intervals and pulse timing may be adjusted in particular so that at least one adjusted pulse 70 is moved (time-shifted) outside of the impingement interval 48' and into an adjacent non-impingement interval. In this way, selected pulses propagate along the optical axis to corresponding targets on the work piece and non-selected pulses are blocked. Similar to the embodiment shown in FIG. 2, the timing system of FIG. 4 further includes two lasers 22' and 24' that generate two independent and stabilized sequences of laser pulses responsive to delay adjusted laser trigger signals 34' and 36'. As shown at 40' and 42', the pulses may be separated in time T+delta (about 2-3 µs). These independent pulse sequences are combined with a polarization type beam combiner 44' to form a combined sequence of laser pulses 46'. The impingement interval 48' transmits one pulse to be output by the system as shown at 50'.

The delay for each non-desired pulse is small enough to maintain stable laser operation by maintaining nearly continuous laser operation and also large enough to block the pulse from irradiating the work piece by moving non-selected pulses into adjacent blocking intervals. In particular, pulses that are not desired are delayed a small amount in time (delta), typically about 2-3 µs, thereby preventing any undesired energy from impinging the workpiece that might cause damage.

In a preferred single-pass processing embodiment wherein both closely spaced pulses are used for processing, the pulse energy of a closely spaced second pulse is reduced to remove any unwanted material remaining after the first pulse while minimizing substrate damage. Here, closely spaced groups of pulses are used to achieve single pass, dual pulse processing, thereby maintaining high single pass processing speed and system throughput by avoiding a second pass and attendant processing time increases and system throughput reduction.

The energy of the second pulse may be any reduced value; preferably the second pulse is between 30% and 60% of the first pulse. Relative pulse energy is set before the acousto-optic modulator for example, by manually or automatically rotating the linear beam polarization of one or both beams prior to the polarization beam combiner.

This single pass technique is well suited to improve yields in green laser frequency memory repair processing and yield improvement gains are significant for green laser frequency processing as compared to infrared (IR) processing. For example, dual pulse green laser frequency systems may increase yield from 96% to 99% whereas dual pulse IR frequency systems may increase yield from 99.6% to 99.8%.

Conveniently, pulse selection from a group of pulses with multiple laser sources is therefore achieved with a single modulator rather than individual modulators for each laser source. The energy of the pulses may also be controlled. The single modulator runs synchronized with target positioning so that the impingement interval allows pulses to irradiate selected targets. Target positioning is accomplished by moving targets relative to the focused laser spot with a precision positioning system such as the fine positioning stage of the M455.

In embodiments of the present invention, groups of pulses may be generated and used in various ways for laser processing. For example, U.S. Patent Application Publication No. 2002/0167581 (hereinafter the Cordingley '581 Published Application), and the disclosure of which is incorporated by reference, discloses methods and systems for multi-pulse laser processing, at least in part, at paragraphs 116-126, 193-202 and 210 thereof. Selected pulses may be delivered either at the same time or in a rapid sequence to a single target, or to multiple targets, while maintaining stable laser pulse energy and pulsing each laser source at a nearly constant rate and power level.

The pulses may be generated having any desired predetermined pulse shape, pulse width, pulse energy, peak pulse power, and temporal spacing. Multiple pulses of controllable width, peak intensity, and shape may be produced, for example, from a continuous laser beam by controlling a modulator as disclosed in pending U.S. Provisional Patent Application Ser. No. 60/938,967 filed May 18, 2007, the disclosure of which is hereby incorporated by reference, which discloses, in part, that bursts of multiple pulses may be output by a modulator over a 10 to 1000 ns period sliced from a substantially continuous seed laser output during on-the-fly link severing processes.

In accordance with certain embodiments of the invention, a single trigger and a programmable electronic delay may be used as an alternative to multiple triggers to trigger each laser at a different time to set the spacing of pulses in the group as shown, for example at FIG. 15a of the Cordingley '581 Published Application. When an electronic delay is used, a fixed value may be programmed and loaded into the laser control hardware.

In one example, a double pulse system is rapidly switched to a single pulse system using delayed pulse pulse-picking to select a desired pulse as the single pulse and at the same time maintain stable laser operation. The single pulses may be generated for example from one laser, or with the combined output of two lasers.

Suitable laser systems include solid state q-switched lasers, fiber lasers, MOPA (Master-Oscillator-Power Amplifier) arrangements seeded with a high speed semiconductor laser diode and amplified with a fiber amplifier, mode-locked lasers, and combinations thereof. The lasers may produce nanosecond, picosecond, or femtosecond outputs.

In at least one embodiment, the groups of pulses may be generated and delayed with directly modulated, high speed semiconductor laser diodes and amplified with at least one fiber optic amplifier (MOPA configuration). The amplifier output will then be propagated through the AOM. In accordance with further embodiments, various fiber-based MOPA configurations may also be employed with systems and methods of the invention.

In accordance with further embodiments of the invention, time shifting of laser pulses relative to synchronized impingement intervals may be used to select a predetermined number of pulses from a group of pulses for example when a single laser source generates a group of pulses. As the delay of the pulse group is varied, different pulses are selected from the group. Generally, it is desirable for the energy in the pulse group to remain substantially constant so that the laser source output remains stable. Pulses within a pulse group however, may have varied properties; and time shifting of pulses may be used to select pulses in a group of pulses having different characteristics while the energy of the entire group remains substantially constant. For example, a group of pulses may include pulses having different pulse widths, different pulse shapes, or different pulse energies. This type of pulse property selection can be used to select a low energy portion of a pulse group, for example for a low energy alignment pulse. Pulse energy may be transferred from pulses within an impingement interval to pulses outside of the impingement interval without changing the time shift so as to vary a pulse energy characteristic while maintaining substantially constant energy of the pulse group.

In some laser sources there may be a significant time required to set-up and calibrate a change in pulse characteristics. Rather than change pulse characteristics within a pulse group, multiple pulses with varying characteristics can be included in a single pulse group. Time-shifting of the group may be used to allow rapid selection of pulse characteristics in a laser processing operation. For example, if two pulse types are to be used in a single processing run, time shifting may be used to select a portion of a group of two pulses to rapidly set the appropriate pulse width and/or pulse energy or pulse shape according processing requirements. In this case with a single laser source, when one pulse of a group is selected, the unselected pulses are blocked during the non-impingement period either before or after the impingement period of the selected pulse.

Figure 8:
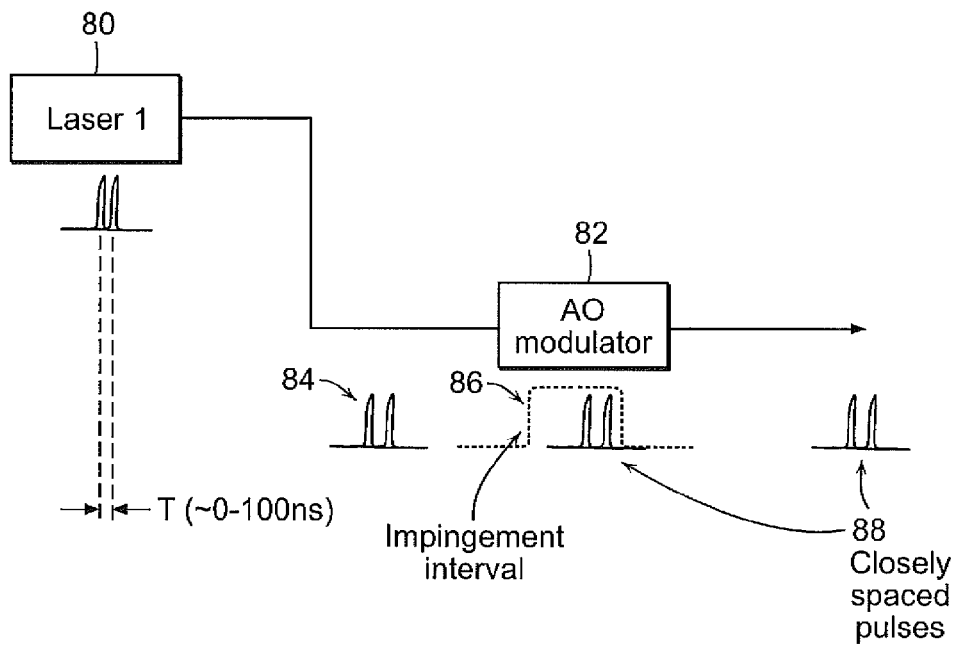
FIG. 8 shows an illustrative schematic diagram showing dual pulse generation, pulse timing, and pulse selection in accordance with a further embodiment of the invention.

FIG. 8, shows a pulse timing system in accordance with a further embodiment of the invention that includes one laser source 80 for providing both of the pulses, and a modulator 82. The pulses 84 may be separated by a time of about 0 to 100 ns, and an impingement interval 86, e.g., the window, may transmit output of both of the pulses as shown at 88.

Figure 9:
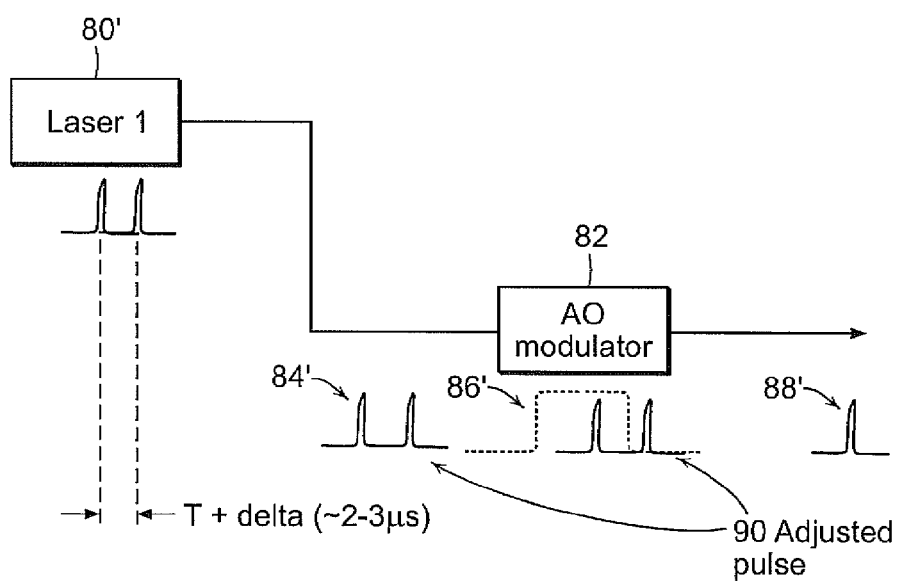
FIG. 9 shows an illustrative schematic diagram showing dual pulse generation, delayed pulse timing, and single pulse selection in accordance with a further embodiment of the invention.

As shown in FIG. 9, in accordance with a further embodiment of the invention, pulse timing may be adjusted so that at least one adjusted pulse 90 is moved (time-shifted) outside of the impingement interval 86' and into an adjacent non-impingement interval similar to the system shown in FIG. 7 except that one laser source 80' is used to generate both pulses 84'. In this way, selected pulses propagate along the optical axis to corresponding targets on the work piece and non-selected pulses are blocked. Similar to the embodiment shown in FIG. 8, the timing system of FIG. 9 further includes a modulator 82' that provides the impingement interval 86'. The pulses may be separated in time T+delta (about 2-3 µs). The impingement interval 86' transmits one pulse only to be output by the system and the non-selected pulse 90 is blocked as shown at 88'.

Pulse characteristics that may be selected by using different portions of a pulse group include pulse energy, pulse shape, and pulse width. Pulse energy is to be understood as the energy emitted during an interval of time. The time interval may be a fixed value or may be determined from relative power values during the pulse for example full width half maximum, 10% of peak, and the like. The term pulse shape is intended to refer to a temporal profile of the pulse that can be plotted in a graph of power vs time. For example, pulse shapes may include Gaussian, square, spikes, squiggly, wavy, saw tooth, or other waveforms. Preferable, an externally modulated, fiber amplified cw seed laser is used to generate variable pulse shapes in response to a control signal.

In alternative embodiments, it may be advantageous to provide a high speed interface to the laser source to allow faster setting of laser parameter. For example an RS-232 serial interface might be replaced with an IEEE 1394 or other standard high speed interface. When parameters of a pulse group can be set-up fast enough, for example within 10 microseconds or faster, then on-the-fly configuration of pulse properties is possible for typical processing rates that correspond to a 100 kHz repetition rate of the impingement interval. It is to be understood that the precise time period required to set-up a laser for on-the-fly processing will depend on the processing rate. Faster or slower rates will respectively need faster or slower laser pulse parameter set-up. Even when parameters can not be changed fast enough to set-up for every impingement interval, high speed set-up may benefit overall throughput by setting-up the pulse parameter for different portions of a processing run. These portions may include different groups of targets to be processed or different types of targets such as alignment targets and processing targets.

In accordance with certain embodiments of the invention, pulse groups of three pulses may be used, and three, two, one or no pulses may be selected to be within impingement intervals as shown in FIGS. 10A-10C. As shown in FIG. 10A, the impingement intervals W of the modulator responses 160 are synchronized to a repetition sequence having periods $P_1$, $P_2$, $P_3$ as shown corresponding to microstructure locations, and different respective time shifts $t_1$, $t_2$, $t_3$ and $t_4$ for the pulse group are used to select the number of pulses from the groups 162, 164, 166 and 168 (shown in FIG. 10B) that occur in the impingement interval. Generally, the periods $P_1$, $P_2$ and $P_3$ are all be the same length when processing a regularly spaced group of microstructures, but in other embodiments, for example when spacing or timing of microstructure to be processed is irregular, the periods may be non-constant. The shift may be applied to the entire pulse group or to a subset of pulses within the group to provide output groups of three, two, one or no pulses as shown at 172, 174, 176 and 178 respectively in FIG. 10C. The system therefore simply selects the appropriate time shift for the impingement interval sequence that will provide the desired output.

FIGS. 10D and 10E show that if the pulse groups each include one or more pulses 180 of pulse shape that is different from other pulses in the group 182, then the impingement interval may cause either one type of pulse or pulses 184 to impinge the workpiece, or may cause another type of pulse 186 to impinge the workpiece.

Embodiments of time shifted pulses may be used with multiple beam processing. When single source or multiple source combined beams are used, time shifted pulses can be used to select pulses from a particular beam source. When a single source is split, a time shift would generally be applied to at least one beam by means of an optical delay, preferably a variable optical delay. A combination of an optical delay and triggering delay or multiple optical delays can be used to select pulses from either beam. Conveniently, with multiple sources, multiple triggering delays can be used.

Generally, time shifting with multiple beams can be used to switch between beam properties not limited to pulse properties. For example, differences in laser sources, beam paths, and optical elements in beam paths can impart different beam properties; and time shifting can be used to effectively switch beams and select beam properties.

The combined beam paths can be divergent so that laser spots are formed offset relative to one another. They may be offset along the direction of travel of the spots relative to the links and on different target links in a row of links; for example offset to adjacent or non-adjacent links along a row of links. Likewise, laser spots may be offset in a direction perpendicular to the direction of travel, alone or in combination to an offset in the direction of travel to links in different rows of links that may be aligned perpendicular, offset or staggered in the direction of travel of the spots relative to the links. Using time shifting, pulses of one or more combined beams may be shifted outside an impingement window to select working pulses for impingement from multiple beams with a single AOM while maintaining stable laser operation.

Using a single AOM or acousto-optic deflector with sources can eliminate differential drift associated with multiple acousto-optic devices. With a single device, drift is essentially common mode with can improve beam to beam pointing accuracy and reduce multi-beam calibration requirements.

FIG. 11A-11C show a pulse timing and modulation system in accordance with a further embodiment of the invention in which the modulation control signal also provides an irregular modulation signal that selectively blocks pulse group 192 and transmits output pulses 190 from groups of laser pulses 192 during an impingement interval 194 that aligns with the pulses 192. As shown at 196, certain of the modulation amplitude control signals may be provided at a higher energy level to offset suppressed energy that would occur with an impingement interval at 194' in which no modulation occurs in order to facilitate management of temperature fluctuations in the modulator. As described above, the time period between blocked group 192' output 190 is set to stabilize the energy of output 190.

In accordance with further embodiments of the invention a polarized or non-polarized beam combining technique may be used to combine the outputs of different laser sources into a group of closely spaced pulses as disclosed for example, in paragraphs 193-203 of the Cordingley '581 Published Application, the disclosure of which is incorporated by reference.

Numerous alternatives for delivering one or more laser pulses to one or more targets (with the use of EO modulators for rapid switching of beam paths) may also be employed, for example, as disclosed in U.S. Pat. No. 6,541,731 (the Mead '731 patent), the disclosure of which is hereby incorporated by reference. The apparatus of the Mead '731 patent uses two or more laser systems to achieve processing parameter flexibility. The output beams from the independently controlled laser systems are combined using a beam splitter that combines the beams into single or multiple processing beams. The operational flexibility of the system can be further enhanced through the use of multiple EO modulators and a polarization sensitive beam splitter. FIG. 9 of the Mead 731 patent is an illustration of a system utilizing three laser systems that operate independently to achieve the desired output characteristics; FIG. 10 of the Mead '731 patent is an illustration of an alternate embodiment of the invention in which the output from two independent laser systems is combined with a polarizing beam splitter; and FIG. 11 of the Mead '731 patent is an illustration of an alternate embodiment of the invention utilizing EO modulators.

Methods and systems for laser processing with selected wavelengths and pulse picking may also be employed as disclosed therein as well. For example, different laser sources of different operating wavelengths may be employed, and the laser sources may be infrared, visible or ultraviolet and the wavelength could be 1.32 um, 1.064 um, 1.047 um, 0.532 um, 0.351 um, 0.266 um or other available laser lines, shifted laser lines, or frequency multiplied laser lines.

Processing characteristics for memory repair can vary significantly with wavelength as disclosed, for example in U.S. Pat. No. 6,559,412 (the disclosure of which is hereby incorporated by reference) and in at least paragraphs 149-156 of the Cordingley '581 Published Application. The silicon substrate is transmissive at the IR wavelengths and is generally insensitive to damage. For visible and ultraviolet wavelengths however, silicon has significant absorption and low energy pulses are used to avoid substrate damage. One result of low energy visible and UV processing may be reduced yields due to incomplete removal of material.

In one application of an embodiment of the present invention, system alignment to better than about 0.18 microns may be achieved if two lasers are stabilized and one is selected for alignment while the other is effectively blocked by selectively time-shifting a pulse outside of the impingement window. Rapid switching between stabilized lasers is possible without excessive settling time. In this embodiment alignment may be achieved using well known edge scanning techniques applied to each beam individually as shown, for example at FIGS. 10, 14a and 14b of the Cordingley '581 Published Application, and as disclosed for example, in pages 16-20 of "Link Processing with Lasers", by Don Smart and John Edwards, published by General Scanning, Inc. 1998, the entire disclosure of which is hereby incorporated by reference. Further, for coincident or offset pulses, alignment to the workpiece and relative spatial alignment of pulses are critical. Various alignment schemes known in the field of laser processing may be used in multiple pulse processing as disclosed, for example at paragraphs 129-131 and 177 of the Cordingley '581 Published Application.

In yet another embodiment, two trigger signals may be delayed at the same time to block both beams. This technique may be used for example to detect background energy in an alignment or calibration routine. When both triggers are delayed, the modulator may also be thermally stabilized by using regularly spaced impingement intervals to provide a more uniform thermal load.

Different types of optical modulators may be used such as acousto-optic modulators, and electro-optic. Generally acousto-optic modulators are preferred for pulse picking a single pulse or a group of pulses at rates up to about 100 kHz, however the invention may be practiced with any modulator having impingement intervals and blocking intervals. An acousto-optic deflector may be used as the modulator or may be used in addition to the modulator.

The selected pulses will generally be focused into a spot on the workpiece with a single objective lens. Multiple pulses may be directed through multiple optical paths to multiple lenses.

Those skilled in the art will appreciate that numerous modifications and variations may be made to the above disclosed embodiments without departing from the spirit and scope of the invention.

What is claimed is:

1. A method of laser-based processing a workpiece along a continuous motion trajectory, said method comprising the steps of:
    generating at least two laser pulses closely spaced in time in response to a variable timing signal;
    selecting at least two pulses of the closely spaced pulses during the continuous motion trajectory corresponding to a workpiece target with an optical modulator that is controlled according to a command sequence of pulse impingement intervals and non-impingement intervals to allow each selected pulse to impinge the workpiece target during a pulse impingement interval;
    changing the variable laser pulse timing signal to vary the spacing of the closely spaced pulses, wherein at least one pulse time is shifted from an impingement interval to an adjacent non-impingement interval, and
    blocking the at least one shifted pulse from impinging the workpiece during non-impingement interval with the optical modulator;
    wherein the variable laser pulse timing signal is sufficiently continuous to maintain stable laser operation.

2. The method as claimed in claim 1, wherein said method further includes the steps of:
    focusing the selected at least two laser pulses on the workpiece; and
    precisely positioning at least one microstructure of a multi-material device relative to the focused at least two laser pulses.

3. A method of processing a multi-material device including a substrate and at least one microstructure that occurs with multiple pulses in a single pass operation along a relative trajectory and that is controlled with a positioning subsystem of a processing system, the method comprising the steps of:
    inducing relative motion between the multi-material device and a laser beam waist;
    initiating an impingement interval related to a target position during relative motion that allows one or more laser pulses to impinge a workpiece at a target location;
    generating a first laser pulse at a time corresponding to the target location in the relative trajectory;
    irradiating the target during the impingement interval with the first laser pulse,
    generating a second laser pulse at a time delayed relative to the first pulse during a non-impingement interval adjacent to the impingement interval, and
    blocking the second pulse from irradiating the target or non-target material during the non-impingement interval,
    wherein a first beam waist associated with the first pulse and the target substantially coincide, and wherein the delay is a predetermined time relative to the first pulse that is small enough to maintain stable laser operation and large enough to move the delayed pulse from the impingement interval to the adjacent non-impingement interval.

4. The method as claimed in claim 3, wherein the first and second pulses are independently triggered.

5. The method as claimed in claim 3, wherein the predetermined time is determined by a thermal property of the multi-material device.

6. The method as claimed in claim 3, wherein the predetermined time is in the range of about 1-500 nanoseconds.

7. The method as claimed in claim 3, wherein the step of generating the first laser pulse includes generating the first laser pulse with a first laser and wherein the step of generating the second laser pulse includes generating the second laser pulse with a second laser, and wherein relative delay between pulses corresponds to the predetermined time.

8. A method of selecting laser pulses from a group of laser pulses with an optical modulator, said method comprising the steps of:
generating a group of laser pulses corresponding to a laser timing signal, a first portion of the group of laser pulses corresponding to a workpiece target moving relative to the laser pulses, and a second portion of the group of laser pulses corresponding to a non-impingement interval adjacent to an impingement interval that is associated with the first portion of the group of laser pulses;
controlling an optical modulator according to a command sequence of impingement intervals and non-impingement intervals,
selecting the first portion of the group of laser pulses with the optical modulator to allow each selected pulse to impinge the workpiece target during a pulse impingement interval; and
blocking the second portion of the group of laser pulses from impinging the workpiece.

9. The method as claimed in claim 8, further comprising the step of adjusting the laser timing signal to generate an adjusted group of pulses relative to the workpiece, wherein step of adjusting the laser timing signal moves a shifted pulse from the second portion of the group of laser pulses to the first portion of the group of laser pulses, whereby the shifted pulse is selected during an impingement interval.

10. The method claimed as in claim 8, further comprising the step of adjusting the laser timing signal to generate an adjusted group of pulses relative to the workpiece, wherein the step of adjusting the laser timing signal moves a shifted pulse from the first portion of the group of laser pulses to the second portion of the group of laser pulses, whereby the shifted pulse is blocked from impinging the workpiece.

11. The method as claimed in claim 8, wherein the step of generating the group of laser pulses includes generating a group of pulses having different pulse properties, and wherein selected pulses have desired pulse properties according to the laser timing signal.

12. The method as claimed in claim 8, wherein the step of selecting the first portion of the group of laser pulses selects a desired number of pulses from the group of laser pulses.

13. The method as claimed in claim 8, wherein the step of generating the group of laser pulses comprises generating a first sequence of laser pulses corresponding to a first laser trigger signal, generating a second sequence of laser pulses corresponding to a second laser trigger signal, and propagating the first and second sequences of laser pulses to the optical modulator; and wherein the method further comprising adjusting the timing of at least one trigger signal according to desired pulse selection,
wherein corresponding pulses from the first and second sequences form a group of pulses that are closely spaced in time and the pulse spacing is in the range of about 1-500 ns.

14. The method as claimed in claim 13, wherein the first pulse sequence is generated with a first laser source and the second pulse sequence is generated with a second laser source.

15. A method of stabilizing a laser pulse sequence in an aligned multiple pulse laser processing system, said method comprising the steps of:
generating a first sequence of laser pulses responsive to a laser pulse timing signal, wherein pulses in a first portion of the first sequence are generated at times corresponding to positions of targets of a workpiece moving along a continuous processing trajectory relative to the laser pulses;
selecting one or more pulses of the first sequence with an optical modulator that is controlled according to a command sequence of impingement intervals and non-impingement intervals to allow each selected pulse to impinge a workpiece target during a pulse impingement interval; and
adjusting the pulse timing signal of a second portion of the first sequence of laser pulses relative to the workpiece, wherein pulses in the second portion of the first sequence are generated at times corresponding to non-impingement intervals that are adjacent to impingement intervals, thereby blocking pulses of the first pulse sequence from impinging the workpiece;
wherein the steps of generating and adjusting maintain a substantially continuous and stabilized first pulse sequence.

16. The method as claimed in claim 15, further comprising the steps of:
generating a second sequence of laser pulses, wherein pulses in a portion of the second sequence are generated at times corresponding to positions of targets of the workpiece; and
selecting one or more pulses of the second sequence with the optical modulator according to the command sequence of impingement intervals and non-impingement intervals to allow each selected pulse to impinge at least one workpiece target during a pulse impingement interval.

17. The method as claimed in claim 16, wherein a selected pulse of the second sequence corresponds to a pulse in the first sequence and the corresponding pulse is adjusted in time and blocked in an adjacent non-impingement interval.

18. The method as claimed in claim 16, wherein a selected pulse of the second sequence corresponds to a selected pulse in the first sequence, whereby multiple pulses impinge a workpiece target during an impingement interval to process a microstructure.

19. The method as claimed in claim 16, wherein said method further includes the step of setting a delay between the impinging pulses of the first and second sequence from 1 to 500 nanoseconds.

20. The method as claimed in claim 16, wherein the first pulse sequence is generated with a first laser source and the second pulse sequence is generated with a second laser source.

21. A stabilized system for laser processing a multi-material device including a substrate and at least one microstructure that occurs with multiple pulses in a single pass trajectory, said stabilized system comprising:
pulse generating means for generating first and second pulses in response to an adjustable laser pulse timing signal;
modulator means for modulating the first and second laser pulses in response to a command sequence of impingement intervals corresponding to microstructures and adjacent non-impingement intervals;
signal generating means for generating the adjustable laser pulse timing signal according to the trajectory and a desired pulse delay between the first and second pulses;

command generating means for generating the command sequence of impingement intervals and non-impingement intervals during the trajectory; and irradiating means for irradiating the microstructure during the impingement interval with selected pulses, wherein a beam waist associated with each selected pulse and the microstructure substantially coincide, wherein said modulator means includes means to block the second pulse when the second pulse delay relative to the microstructure is large enough to move the second pulse from the impingement interval an adjacent non-impingement interval thereby blocking the second pulse from irradiating at least one microstructure, and wherein the adjustable laser pulse timing signal provides for selection of the first pulse during the impingement interval and wherein the delay is small enough to maintain stable operation.

22. The stabilized system as claimed in claim 21, wherein said pulse generating means further comprises:

first means for generating a first pulse having a first predetermined characteristic, second means for generating a second pulse having a second predetermined characteristic, the second pulse delayed a predetermined time relative to the first pulse.

23. The stabilized system as claimed in claim 21, wherein said system further includes at least one laser source and a controller coupled to each laser source and the modulator means to control pulse propagation with variable pulse timing.

24. The stabilized system as claimed in claim 21, wherein said system further includes two q-switched frequency doubled laser sources.

25. The stabilized system as claimed in claim 21, wherein said system further includes a single fiber laser source with a programmable pulse profile, wherein the laser timing signal generates groups of at least two closely spaced pulses.

26. The system as claimed in claim 21, wherein said system further includes:

an optical system to focus the laser pulses and a positioning system to precisely locate at least one microstructure of a multi-material device relative to the focused laser pulses.

* * * * *